United States Patent
Shakuda

[19]

[11] Patent Number: 6,060,727
[45] Date of Patent: May 9, 2000

[54] LIGHT EMITTING SEMICONDUCTOR DEVICE

[75] Inventor: Yukio Shakuda, Kyoto, Japan

[73] Assignee: Rohm Co., Ltd., Kyoto, Japan

[21] Appl. No.: 09/314,850

[22] Filed: Jun. 26, 1997

Related U.S. Application Data

[63] Continuation of application No. 08/513,623, Aug. 10, 1995, abandoned.

[30] Foreign Application Priority Data

Aug. 11, 1994 [JP] Japan ................................. 6-189566

[51] Int. Cl.⁷ .................................................. H01L 33/00
[52] U.S. Cl. ............................... 257/90; 257/89; 257/94; 257/99; 257/96
[58] Field of Search ............................. 257/88–91, 94–96, 257/97, 99

[56] References Cited

U.S. PATENT DOCUMENTS

| | | | |
|---|---|---|---|
| 4,148,045 | 4/1979 | Fang et al. | 257/90 |
| 4,614,958 | 9/1986 | Mikami et al. | 257/90 |
| 5,281,830 | 1/1994 | Kotaki et al. | 257/91 |
| 5,459,337 | 10/1995 | Ito et al. | 257/89 |

FOREIGN PATENT DOCUMENTS

| | | | |
|---|---|---|---|
| 2-7581 | 1/1990 | Japan | 257/89 |
| 2-283079 | 11/1990 | Japan | 257/89 |
| 3-292779 | 12/1991 | Japan | 257/99 |
| 4-209577 | 7/1992 | Japan | 257/99 |
| 5-63236 | 3/1993 | Japan | 257/99 |
| 5-347432 | 12/1993 | Japan | 257/89 |
| 6-163988 | 6/1994 | Japan | 257/89 |
| 2 277405A | 10/1994 | United Kingdom . | |

*Primary Examiner*—John Guay
*Attorney, Agent, or Firm*—Michael D. Bednarek; Crowell & Moring LLP

[57] ABSTRACT

A light emitting semiconductor device is provided which comprises a common substrate having a support surface, and a plurality of laminate structures formed at different regions on the support surface of the common substrate. Each of the laminate structures has at least one N-type layer, a light emitting layer and at least one P-type layer. The light emitting layer emits light at least perpendicularly to the support surface of the substrate. The laminate structures at the different regions are made to emit light of a different wavelength.

7 Claims, 8 Drawing Sheets

LIGHT EMITTING SEMICONDUCTOR DEVICE

This application is a continuation of application Ser. No. 08/513,623, filed Aug. 10, 1995 now abandoned.

BACKGROUND OF THE INVENTION

1. Field of the Invention

This invention relates to a light emitting semiconductor device, and more particularly to a light emitting semiconductor device capable of simultaneously emitting light of different colors for generating combined light of a desired color. The present invention also relates to a method of making such a semiconductor device.

2. Description of the Related Art

In recent years, various light emitting semiconductor devices have been developed. In particular, a blue light emitting diode (blue LED) with a high brightness has been made available, wherein gallium nitride (GaN) compound crystal layers are successively grown on a sapphire substrate by organic metal chemical vapor deposition (hereafter abbreviated as "MOCVD").

Specifically, a GaN type blue LED comprises a sapphire substrate on which is a GaN buffer layer is formed, and a crystal layer laminate is formed on the buffer layer. The laminate includes two N-type semiconductor layers (GaN layer and AlGaN layer), a light emitting semiconductor layer (InGaN layer), and two P-type semiconductor layers (AlGaN layer and GaN layer). A cathode electrode is formed on the N-type GaN layer, whereas an anode electrode is formed on the P-type GaN layer.

Conventionally, blue LEDs have found limited use only as a blue light source. However, since the GaN type blue LED described above has been found to provide a sufficient brightness, it can be combined with a green LED and a red LED to generate combined white light. This has opened up the possibility of using a group of LEDs as a white light source for a reflective backlight type liquid crystal display or a transmission type liquid crystal display. Compared with a fluorescent lamp which has been conventionally used as a light source for a liquid crystal display, the use of grouped LEDs provides a great reduction in the overall size and weight of the display while drastically prolonging the service life.

However, the use of grouped LEDs (blue LEDs, green LEDs and red LEDs) as a white light source is still disadvantageous for the following reasons.

First, different kinds of LEDs need be separately mounted on a circuit board, which increases the time required for mounting.

Secondly, the color of the combined light actually recognized by the viewer depends on the number and arrangement of the different kinds of LEDs mounted on the circuit board. Thus, it is very difficult and time-consuming to make adjustment as to the number and arrangement of the different kinds of LEDs at the time of mounting them onto the circuit board. If the adjustment is improper, the resulting combined light may deviate slightly from the intended white color or any other intended color.

In the third place, the checking as to the color of the combined light actually generated by the grouped LEDs need be performed after the LEDs are mounted on the circuit board. Thus, if the combined light is subsequently found to deviate from the intended color, one or more of the LEDs must be replaced by new one or ones, thereby resulting in economical losses.

SUMMARY OF THE INVENTION

It is, therefore, an object of the present invention to provide a light emitting semiconductor device which is capable of simultaneously emitting light of different colors, thereby enabling to generate combined light of a desired color (e.g. white for example) without need for adjusting the arrangement of the device on a circuit board.

Another object of the present invention is to provide a light emitting semiconductor device which can be checked for its light emitting characteristics before mounting to a circuit board or the like.

A further object of the present invention is to provide a method of advantageously making such a semiconductor device.

According to a first aspect of the present invention, there is provided a light emitting semiconductor device comprising:

a common substrate having a support surface; and a plurality of laminate structures formed at different regions on the support surface of the common substrate, each of the laminate structures having at least one N-type layer, a light emitting layer and at least one P-type layer, the light emitting layer emitting light at least perpendicularly to the support surface of the substrate;

wherein the laminate structures at the different regions are made to emit light of a different wavelength.

The light emitting semiconductor device described above is capable of simultaneously emitting light of different colors by itself. Thus, it is unnecessary to mount different kinds of light emitting devices (LED) onto a circuit board for generating combined light of a desired color.

Further, the color adjustment and characteristics check of the light emitting semiconductor device can be performed during or immediately after its manufacture. Thus, the time and labor required for mounting the light emitting semiconductor to a circuit board can be greatly reduced while it is also possible to prevent economical losses which might result from the use of unacceptable semiconductor devices.

For generating white light, the laminate structures may typically comprise a first laminate structure for emitting blue light, a second laminate structure for emitting green light, and a third laminate structure for emitting red light.

In one embodiment, a different cathode electrode is provided on the N-type layer of each different laminate structure, whereas a different anode electrode is provided on the P-type layer of each different laminate structure.

In another embodiment, a common cathode electrode is provided on the N-type layers of at least two different laminate structures, whereas a common anode electrode is provided on the P-type layers of at least two different laminate structures.

The laminate structures may be arranged side-by-side in contact with each other. Alternatively, the laminate structures may be arranged side-by-side and spaced from each other.

According to another aspect of the present invention, there is provided a method of making a light emitting semiconductor device which comprises: a common substrate having a support surface; and a plurality of laminate structures formed at different regions on the support surface of the common substrate, each of the laminate structures having at least one N-type layer, a light emitting layer and at least one P-type layer, the light emitting layer emitting light at least perpendicularly to the support surface of the substrate; the method comprising the steps of:

forming a first laminate structure at a first region of the common substrate for emitting light of a first wavelength;

forming a second laminate structure at a second region of the common substrate for emitting light of a second wavelength; and forming a third laminate structure at a third region of the common substrate for emitting light of a third wavelength.

According to a further aspect of the present invention, there is provided a method of making a light emitting semiconductor device which comprises: a common substrate having a support surface; and a plurality of laminate structures formed at different regions on the support surface of the common substrate, each of the laminate structures having at least one N-type layer, a light emitting layer and at least one P-type layer, the light emitting layer emitting light at least perpendicularly to the support surface of the substrate; the method comprising the steps of:

forming a first laminate structure over the entire support surface of the common substrate for emitting light of a first wavelength;

masking a portion of the first laminate structure at a first region for etching a non-masked portion of the first laminate structure;

forming a second laminate structure on the support surface of the common substrate at a portion thereof corresponding to the etched non-masked portion of the first laminate structure for emitting light of a second wavelength;

masking a portion of the second laminate structure at a second region for etching a non-masked portion of the second laminate structure;

forming a third laminate structure on the support surface of the common substrate at a portion thereof corresponding to the etched non-masked portion of the second laminate structure for emitting light of a third wavelength.

Other objects, features and advantages of the present invention will be fully understood from the following detailed description given with reference to the accompanying drawings.

DETAILED DESCRIPTION OF THE PREFERRED EMBODIMENTS

Figure 1:
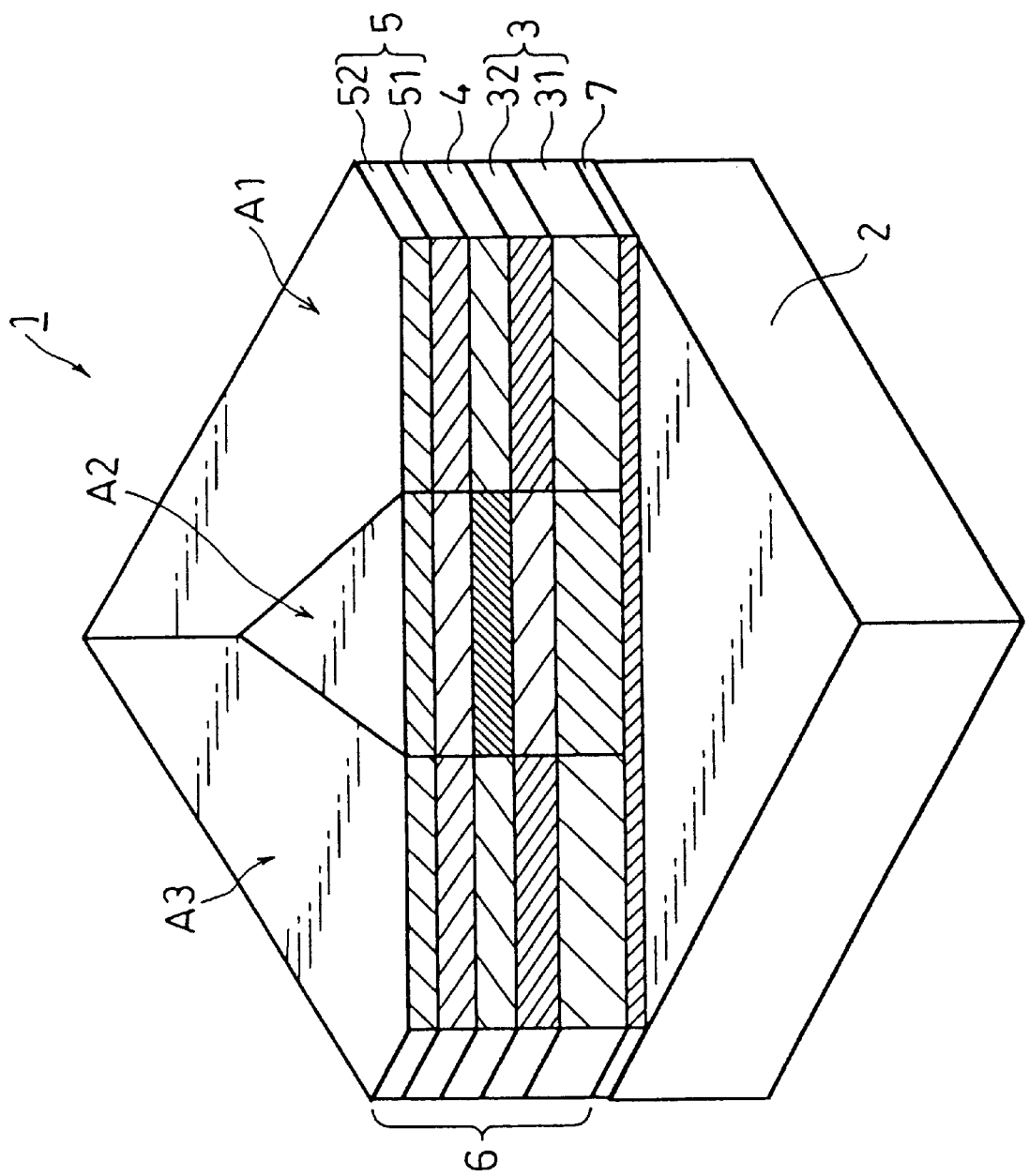
FIG. 1 is a perspective view, partially cut away, showing a light emitting semiconductor device embodying the present invention.

Referring first to FIGS. 1 through 5 of the accompanying drawings, there is shown a light emitting semiconductor device 1 according to a first embodiment of the present invention. The semiconductor device 1 basically comprises a sapphire substrate 2 supporting an overall laminate 6 which comprises two N-type layers 3, a light emitting layer 4, and two P-type layers 5. The substrate 1 may be transparent or semi-transparent. The semiconductor device 1 may have a square form each side of which has a length of 0.5 mm for example.

Figure 2A:
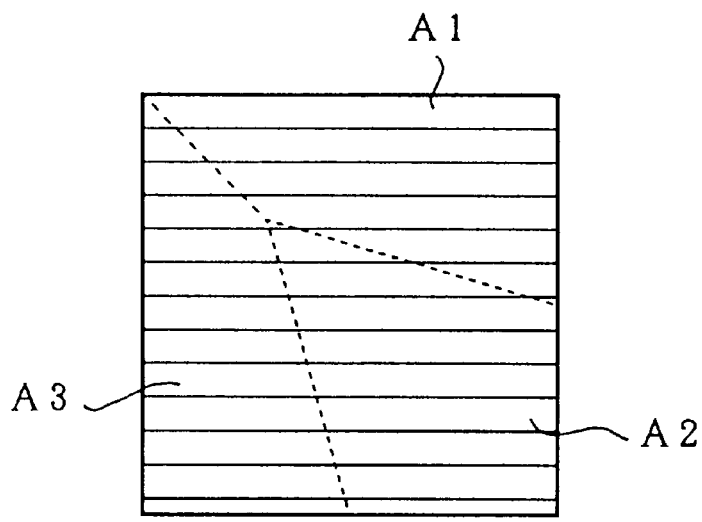
FIGS. 2a through 2c are schematic views showing the successive steps of making the device shown in FIG. 1.

The laminate 6 is formed on a buffer layer 7 of gallium nitride (GaN) which in turn is formed on the substrate 1. The laminate 6 is divided, in a plane parallel to a support surface of the substrate 2, into three different regions which include a first region A1, a second region A2, and a third region A3. Preferably, the three regions A1–A3 of the laminate 6 are generally equal in surface area, as shown in FIG. 2a.

Figure 3:
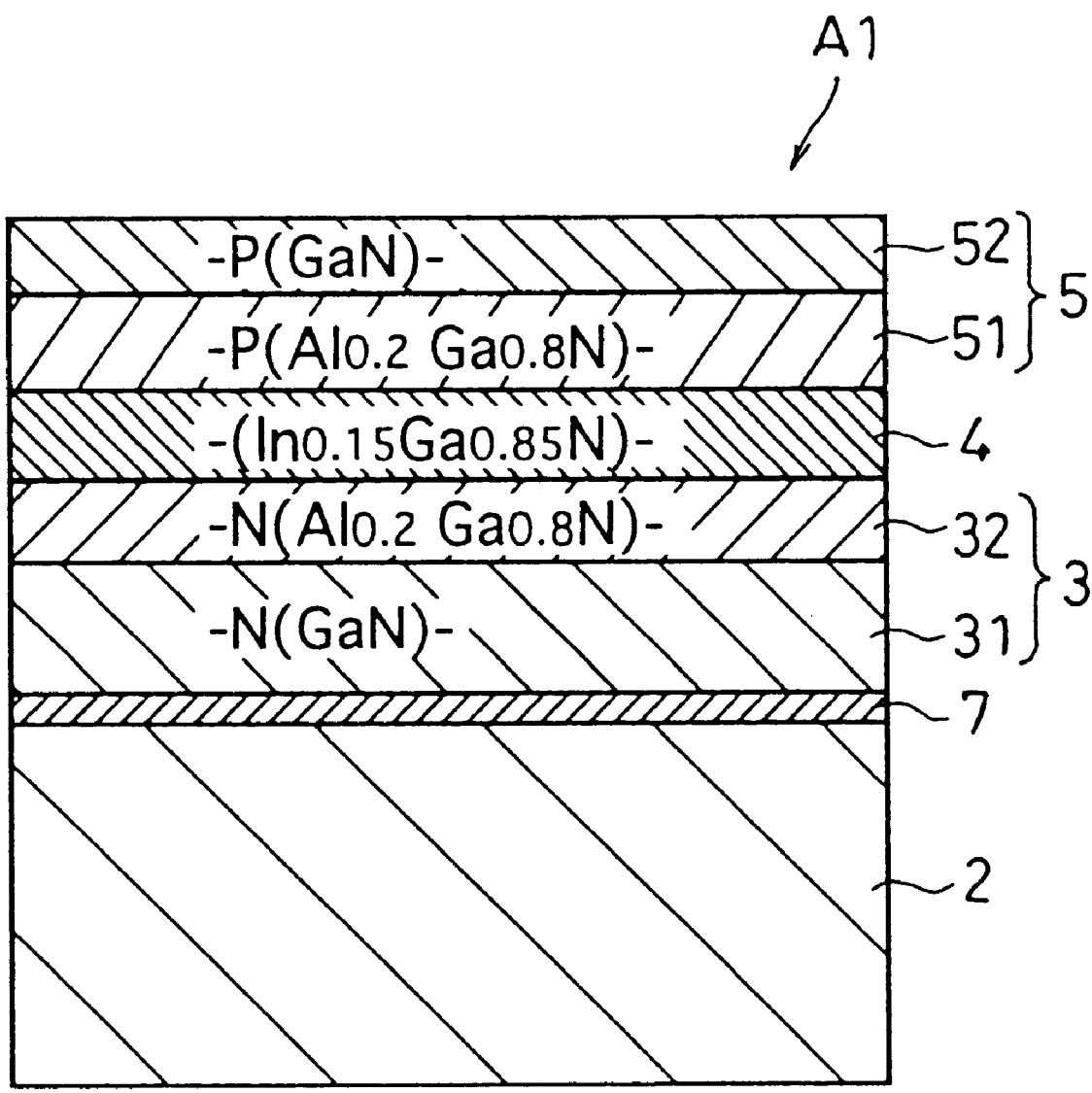
FIG. 3 is a sectional view showing a first region of the device shown in FIG. 1.

The first region A1 of the laminate 6 is a region used for generating blue light which preferably has a wave length of 470 nm. As shown in FIG. 3, the first region A1 comprises an N-type GaN layer 31, an N-type $Al_{0.2}Ga_{0.8}N$ layer 32, an $In_{0.15}Ga_{0.5}N$ layer as the light emitting layer 4, a P-type $Al_{0.2}Ga_{0.8}N$ layer 51, and a P-type GaN layer 52, all of which are successively formed in the mentioned order from the buffer layer 7. The thicknesses of the layers 31, 32, 4, 51 and 52 may be set, respectively, at 3 $\mu$m, 300 nm, 50 nm, 300 nm and 150 nm for example.

The N-type GaN layer 31 and the N-type $Al_{0.2}Ga_{0.8}N$ layer 32 contain silicon (Si) as an additive, whereas the P-type $Al_{0.2}Ga_{0.8}N$ layer 51 and the P-type GaN layer 52 contain magnesium (Mg) as an additive. Further, the $In_{0.15}Ga_{0.85}N$ layer 4 contains zinc (Zn) as an additive. If the mixture ratio (mixed crystal ratio) of In to Ga in the light emitting layer 4 increases, the wave length of the light generated at this layer 4 also increases. Similarly, if the amount of Zn added to the $In_{0.15}Ga_{0.85}N$ layer 4 increases the wave length of the light generated at this layer 4 also increases.

Figure 4:
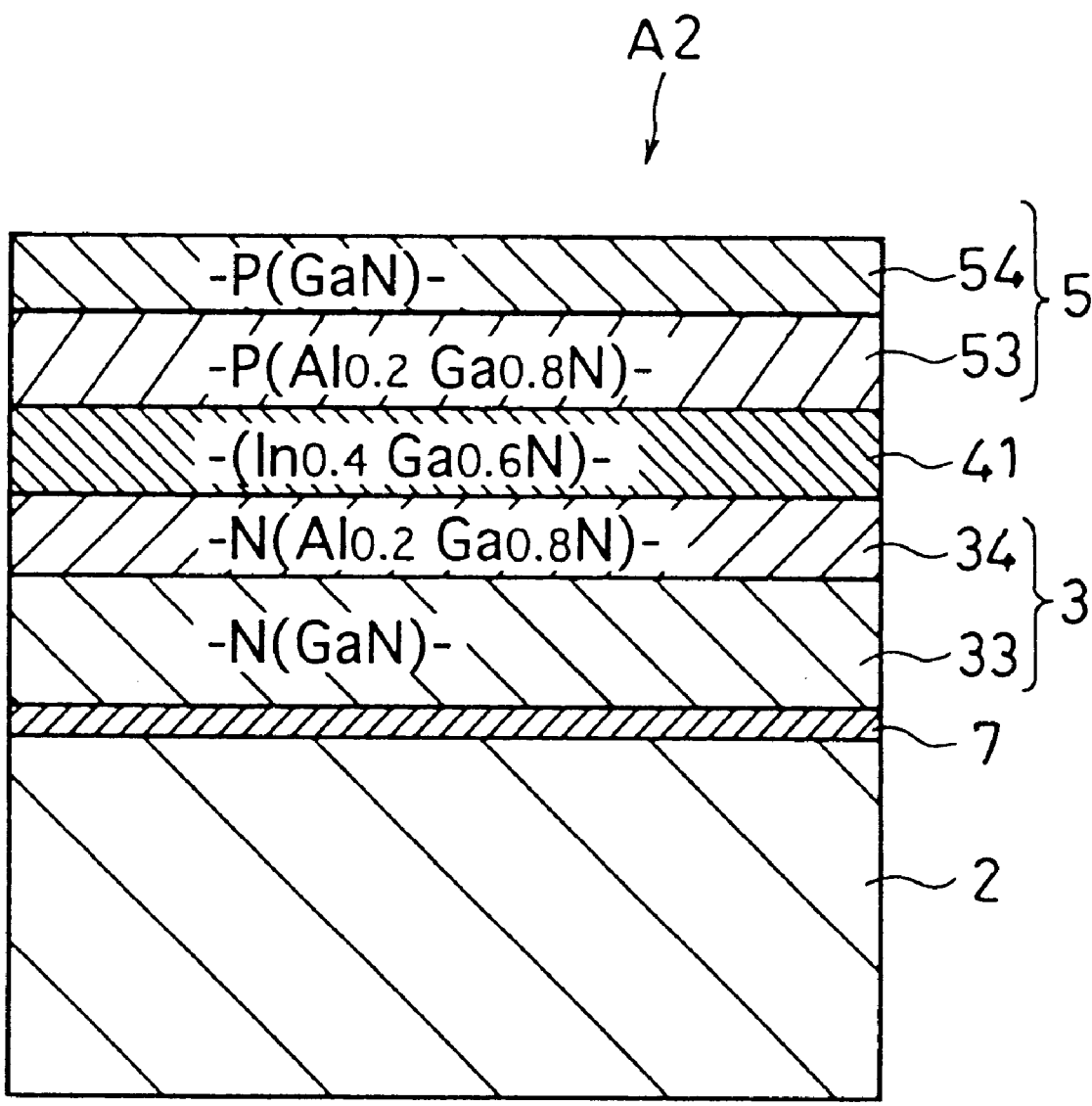
FIG. 4 is a sectional view showing a second region of the device shown in FIG. 1.

The second region A2 of the laminate 6 is a region used for generating green light. As shown in FIG. 4, the second region A2 includes N-type layers 33, 34 and P-type layers 53, 54 which are identical, respectively, to the N-type layers 31, 32 and P-type layers 51, 52 of the first region A1. The only differences reside in that the second region A2 includes a light emitting layer 41 of $In_{0.4}Ga_{0.6}N$, and that the light emitting layer 41 contains a larger amount of Zn, as an additive, than the light emitting layer 4 of the first region A1. The light emitting layer 41 may contain beryllium (Be) and/or selenium (Se) in place of or in addition to Zn. The reason for these differences is that an increase of the In mixture ratio and added Zn amount will increase the wave length of the generated light, thereby enabling a color shift from blue to green.

Figure 5:
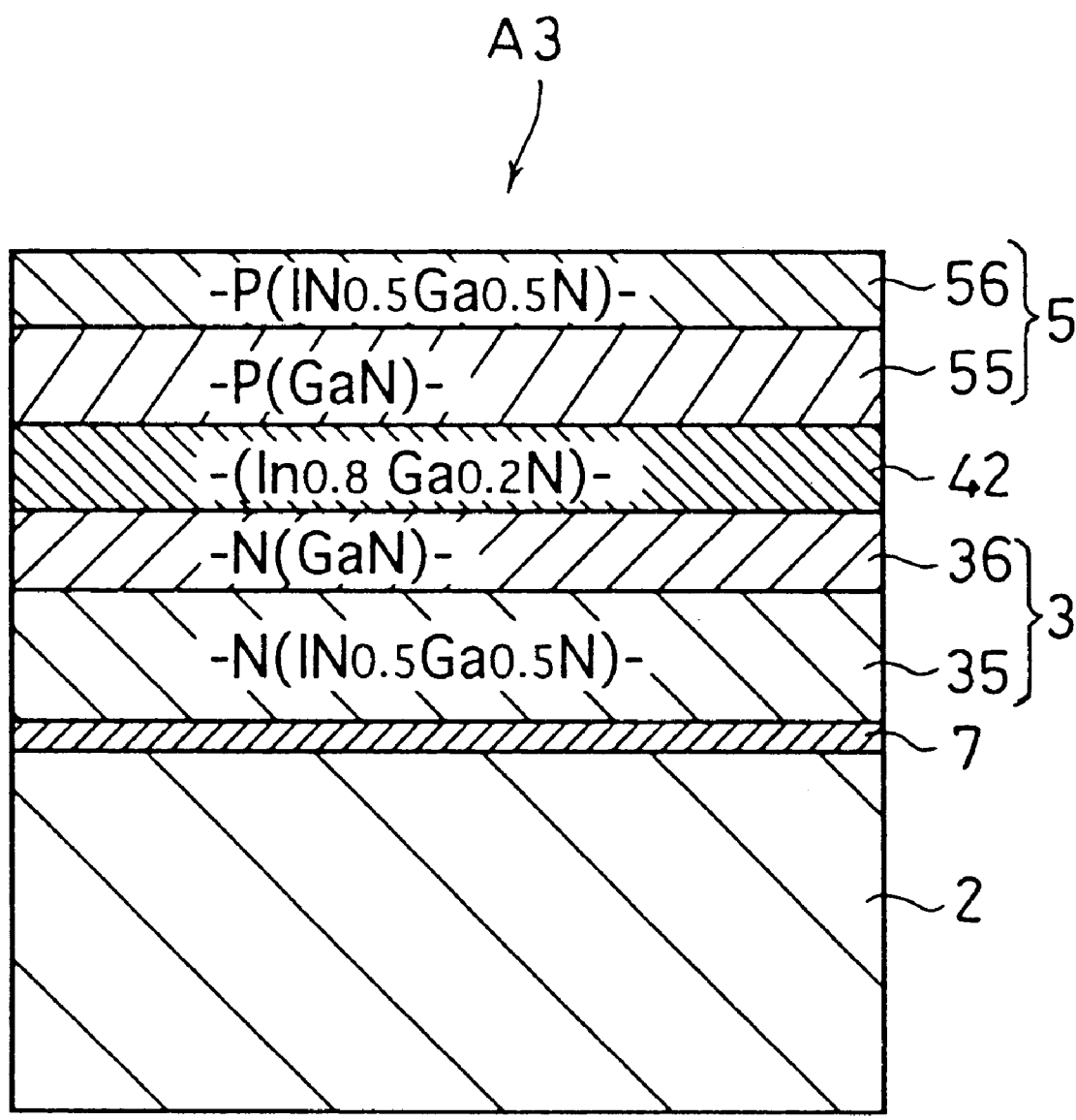
FIG. 5 is a sectional view showing a third region of the device shown in FIG. 1.

The third region A3 of the laminate 6 is a region used for generating red light. As shown in FIG. 5, the third region A3 comprises an N-type $In_{0.5}Ga_{0.5}N$ layer layer 35, an N-type GaN layer 36, an $In_{0.8}Ga_{0.2}N$ light emitting layer 42, a P-type GaN layer 55, and a P-type $In_{0.5}Ga_{0.5}N$ layer 56, all of which are successively formed in the mentioned order from the buffer layer 7. The thicknesses of the layers 35, 36, 42, 55 and 56 may be set equal to the corresponding layers 31, 32, 4, 51 and 52 of the first region A1, respectively.

The light emitting semiconductor device 1 having the above-described structure may be preferably manufactured in the following manner.

First, a GaN buffer layer 7 is formed on a square sapphire substrate 1 by MOCVD, and a first laminate structure used for emitting blue light is formed over the entire surface of the buffer layer 7 by MOCVD wherein each of single crystal layers (layers 31, 32, 4, 51 and 52 in FIG. 3) is successively grown, as shown in FIG. 2a.

Then, only a portion of the thus formed first laminate structure corresponding to the first region A1 is covered by a mask (not shown) made of a $SiO_2$ film, and the remaining non-masked portion of the laminate structure is removed away by etching. The non-masked portion of the laminate structure corresponds in area to the second and third regions A2, A3.

Figure 2B:
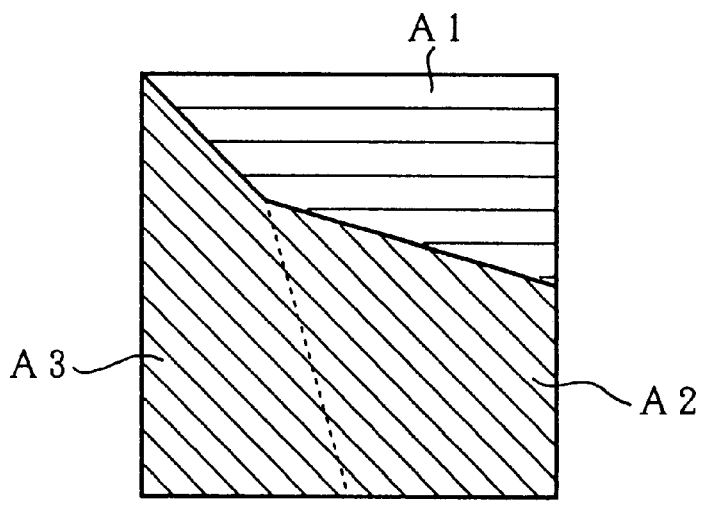

Then, a second laminate structure used for emitting green light is formed over the surface of the buffer layer 7 corresponding to the second and third regions A2, A3 by MOCVD wherein each of single crystal layers (layers 33, 34, 41, 53 and 54 in FIG. 4) is successively grown, as shown in FIG. 2b.

Then, only a portion of the thus formed second laminate structure corresponding to the second region A2 is additionally covered by a mask (not shown) made of a $SiO_2$ film, and the remaining non-masked portion of the second laminate structure is removed away by etching. The non-masked portion of the second laminate structure corresponds in area to the third region A3.

Figure 2C:
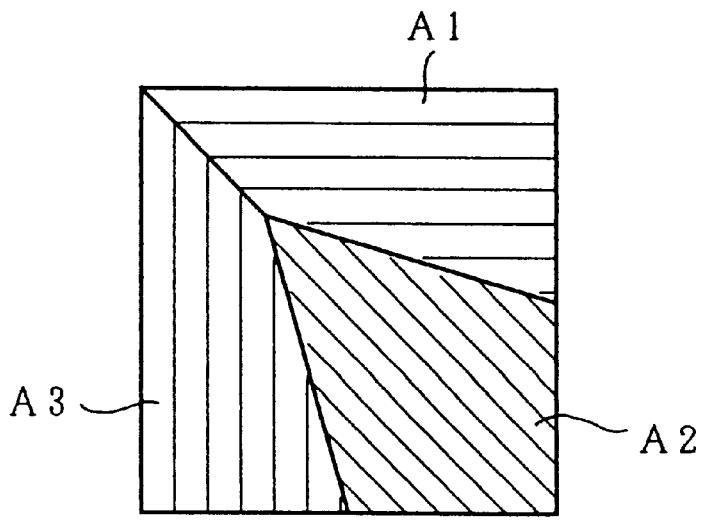

Then, a third laminate structure used for emitting red light is formed over the surface of the buffer layer 7 corresponding to the third region A3 by MOCVD wherein each of single crystal layers (layers 35, 36, 42, 55 and 56 in FIG. 5) is successively grown, as shown in FIG. 2c.

In this way, the light emitting semiconductor device 1 is obtained which has the first, second and third regions A1, A2, A3 for emitting blue, green and red light, respectively, as shown in FIG. 1.

The above manufacturing process is described only with respect to one light emitting semiconductor device. In reality, however, a plurality of such semiconductor devices are manufactured together by performing successive crystal growth on a common sapphire substrate or wafer and thereafter dicing the laminate-wafer structure into the individual semiconductor devices. It should be appreciated that such a collective process is also applicable to other embodiments to be described later with reference to FIGS. 7 and 8a–8c.

The light emitting semiconductor device 1 thus obtained is capable of emitting light in three different colors at the same time. If the amount of light emitted by the respective regions A1–A3 is made equal (e.g. by making the surface areas of the respective regions A1–A3 equal), the combined light is visually recognized as white. The direction of light emission is perpendicular to the support surface of the sapphire substrate 2.

As previously described, it has been conventionally necessary, for providing a white light source, to use three different kinds of light emitting semiconductor devices for separately emitting blue, green and red light while mounting the different kinds of semiconductor devices in a suitable number and arrangement on a circuit board. However, according to the embodiment described above, it is only necessary to use a single kind of light emitting semiconductor devices for generating white light source. Therefore, the light emitting semiconductor device of the present embodiment can be conveniently used as a back light source for a reflection type liquid crystal display or as a light source for a transmission type liquid crystal display in addition to facilitating a mounting operation. Further, the light emitting semiconductor device of the present embodiment contributes to a size and weight reduction of the display and provides a longer service than a fluorescent lamp.

It should be appreciated that the light emitting semiconductor device 1 can be made to emit light from the rear surface of the sapphire substrate 2 which is transparent or semi-transparent.

Figure 6:
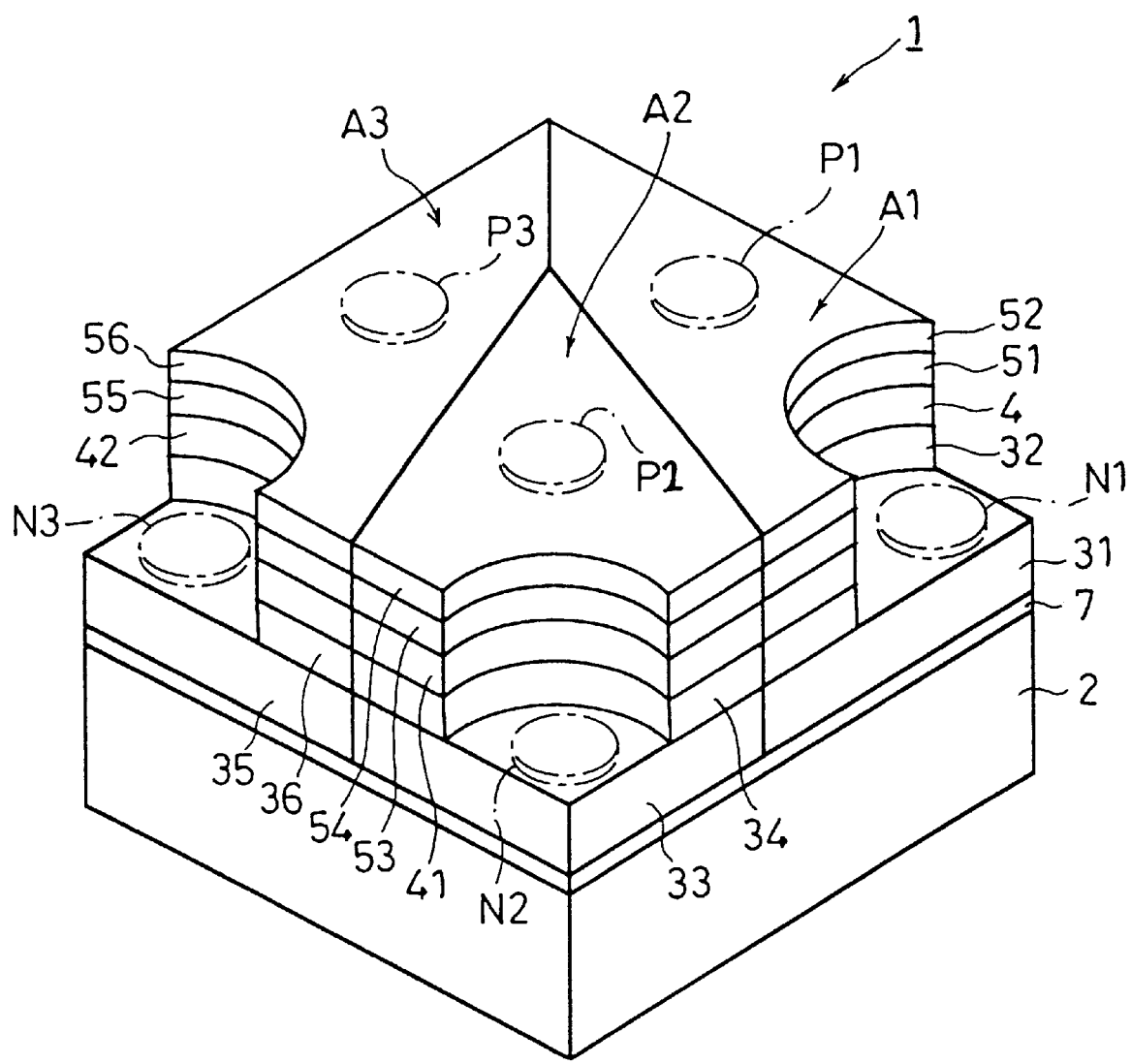
FIG. 6 is a perspective view showing the device of FIG. 1 after formation of electrodes.

FIG. 6 shows an example of electrode arrangement for the light emitting semiconductor device 1 described above. Specifically, three corners of the overall laminate 6 corresponding the first to third regions A1–A3 are arcuately etched to a predetermined depth. Cathode electrodes N1, N2, N3 are formed on the respective N-type layers 31, 33, 35 of the first to third regions A1–A3, whereas anode electrodes P1, P2, P3 are formed on the respective P-type layers 52, 54, 56. Formation of the respective electrodes N1–N3, P1–P3 may be performed by any known methods (e.g. etching and deposition).

Figure 7:
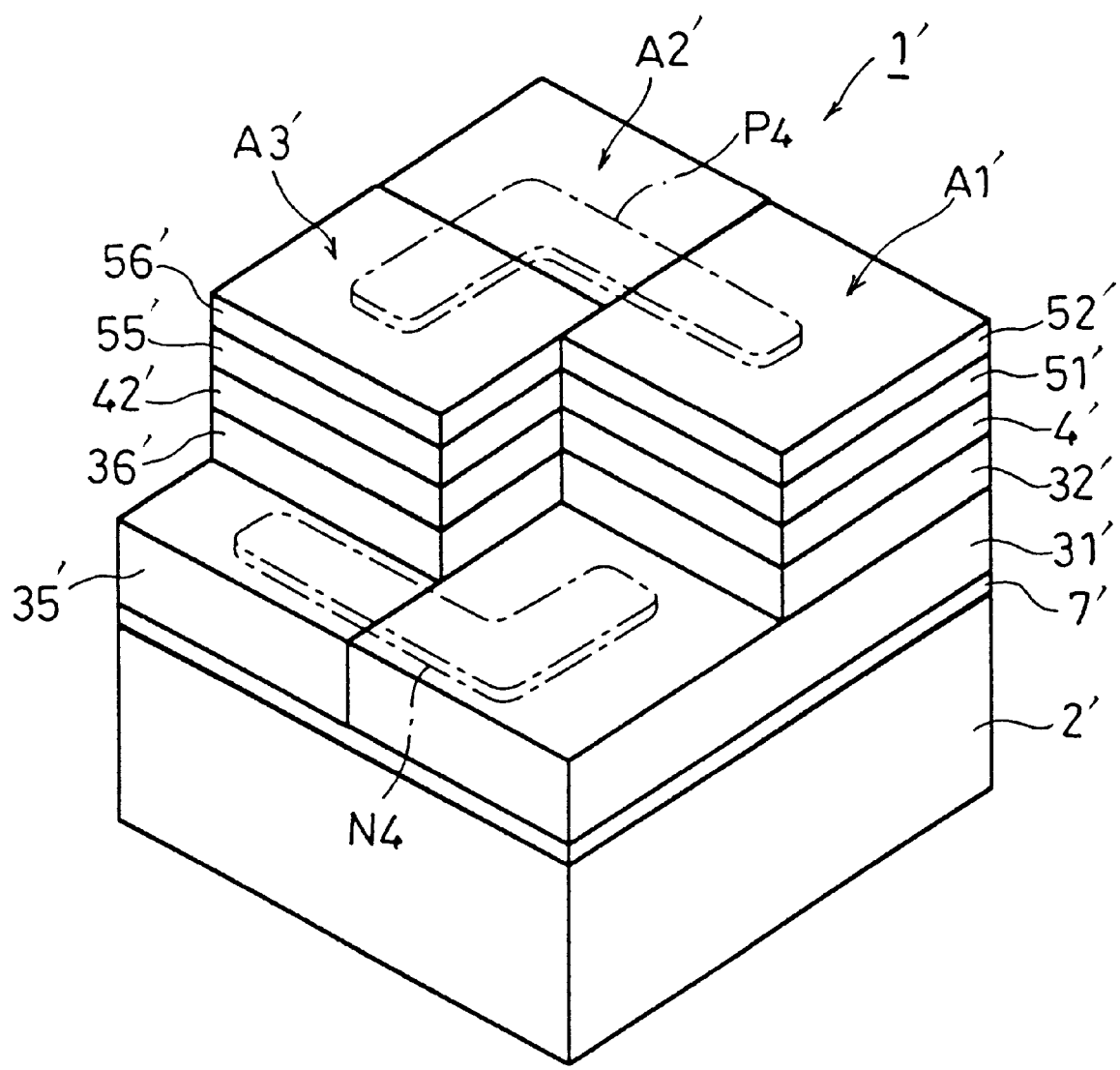
FIG. 7 is a perspective view showing another light emitting semiconductor device embodying the present invention.

FIG. 7 shows a light emitting semiconductor device 1' according to a second embodiment of the present invention. In this embodiment, different parts of the semiconductor device 1' corresponding to those of the first embodiment are represented by identical reference signs with a prime ('), and detailed description of the different parts are omitted for simplicity.

According to the second embodiment, the first to third regions A1'–A3' are equally square in plan view. These regions may be otherwise shaped. According to the second embodiment, further, a common cathode electrode N4 is formed to extend from the N-type layer 31' of the first region A1' to the N-type layer 35' of the third region A3', whereas a common anode electrode P4 is formed to extend over the three regions A1'–A3'. Since the N-type layer or layers (not shown) of the second region A2' is held in electrical conduction with the N-type layers 31', 35' of the first and third regions A1', A3', the common cathode electrode N4 can work commonly also as a cathode electrode for the second region A2'.

Figure 8A:
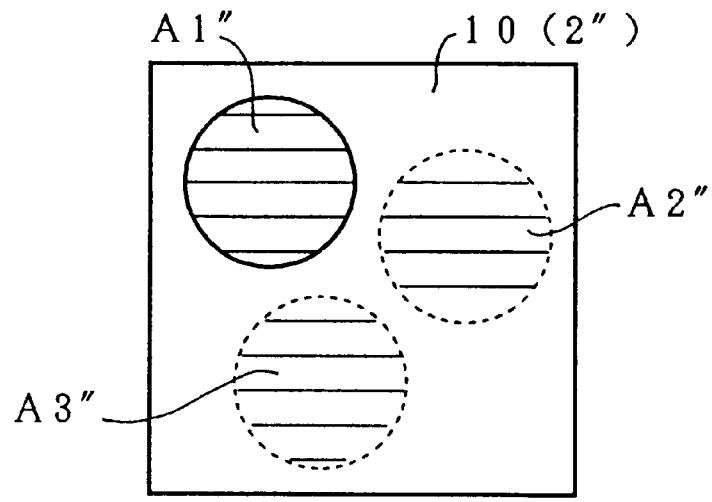
FIGS. 8a through 8c are schematic views showing the successive steps of making a further light emitting semiconductor device embodying the present invention.
Figure 8B:
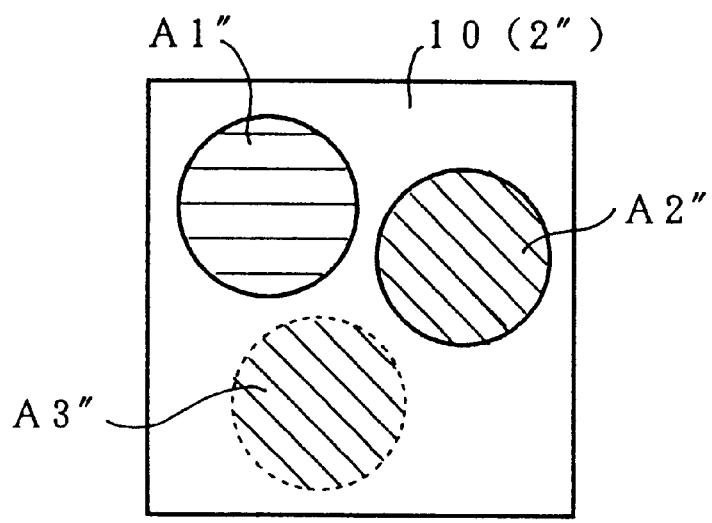
Figure 8C:
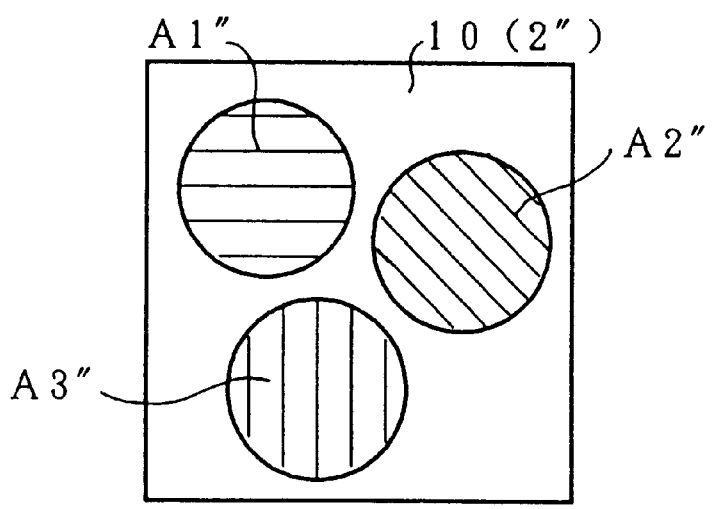

FIGS. 8a through 8c show a light emitting semiconductor device 1" according to a third embodiment of the present invention. In this embodiment, a first, a second and a third regions A1", A2", A3" (laminate structures) are formed independently on a common sapphire substrate 2" which carries an insulating layer 10. The respective regions A1'–A3" are circular and electrically separated from each other by the insulating layer. However, the laminate structures of these regions are substantially identical to those of the first to third regions A1–A3 of the first embodiment.

The light emitting semiconductor device 1" having the above-described structure may be preferably manufactured in the following manner.

First, an insulating layer 10 of $SiO_2$ for example is formed over the entire surface of a square sapphire substrate 2".

Then, the insulating layer 10 is covered by a mask (not shown) except for portions corresponding to the first to third regions A1"–A3", and the non-masked portions (corresponding to the first to third regions A1"–A3") of the insulating layer 10 are removed away by etching.

Then, as shown in FIG. 8a, a first laminate structure used for emitting blue light is formed at each of the first to third regions A1"–A3".

Then, only the laminate structure corresponding to the first region A1" is covered by a mask (not shown), and the laminate structures at the second and third regions A2", A3" are removed away by etching.

Then, a second laminate structure used for emitting green light is formed at the second and third regions A2", A3", as shown in FIG. 8b.

Then, the second laminate structure corresponding to the second region A2" is additionally covered by a mask (not shown), and the second laminate structure at the third regions A3" is removed away by etching.

Then, a third laminate structure used for emitting red light is formed at the third region A3, as shown in FIG. 8c.

The present invention being thus described, it is obvious that the same may be varied in many ways. For instance, the light emitting semiconductor device may be made to have any number of different regions for generating two or more colors, and the color combination is not limited to a blue-green-red combination. Further, the laminate structures in the respective regions may differ from each other only with respect to the light emitting layers. Such variations are not to be regarded as a departure from the spirit and scope of the present invention, and all such modifications as would be obvious to those skilled in the art are intended to be included within the scope of the following claims.

It is claimed:

1. A light emitting semiconductor device comprising:

a common substrate having a support surface; and at least three laminate structures formed at different regions on the support surface of the common substrate, each of the laminate structures having at least one N-type layer, a light emitting layer and at least one P-type layer, the light emitting layer emitting light at least perpendicularly to the support surface of the substrate;

wherein the laminate structures at the different regions are made to emit light of a different wavelength; and wherein the laminate structures are arranged side-by-side each in contact with any other laminate structure to provide respective flat top surfaces which are continuously flush with each other.

2. The device according to claim 1, wherein the laminate structures comprise a first laminate structure for emitting blue light, a second laminate structure for emitting green light, and a third laminate structure for emitting red light.

3. The device according to claim 1, wherein a different cathode electrode is provided on the N-type layer of each different laminate structure, a different anode electrode being provided on the P-type layer of each different laminate structure.

4. The device according to claim 3, wherein the cathode electrode for each different laminate structure is formed at a cutout of said each different laminate structure located at a different corner of the substrate.

5. The device according to claim 4, wherein the cutout of each different laminate structure is arcuately formed.

6. The device according to claim 1, wherein a common cathode electrode is provided on the N-type layers of at least two different laminate structures.

7. The device according to claim 1, wherein a common anode electrode is provided on the P-type layers of at least two different laminate structures.

* * * * *